United States Patent [19]

Efland et al.

[11] Patent Number: 5,744,843

[45] Date of Patent: Apr. 28, 1998

[54] CMOS POWER DEVICE AND METHOD OF CONSTRUCTION AND LAYOUT

[75] Inventors: Taylor R. Efland, Richardson; Dale J. Skelton, Plano, both of Tex.

[73] Assignee: Texas Instruments Incorporated, Dallas, Tex.

[21] Appl. No.: 697,693

[22] Filed: Aug. 28, 1996

[51] Int. Cl.$^6$ .......................... H01L 29/76; H01L 21/265
[52] U.S. Cl. .......................... 257/369; 257/371; 257/377; 257/381; 257/382; 257/754; 257/758; 257/773; 438/199; 438/200; 438/213; 438/223
[58] Field of Search .................. 257/369, 371, 257/377, 381, 382, 754, 758, 773; 438/199, 200, 213, 223

[56] References Cited

U.S. PATENT DOCUMENTS 5,229,633  7/1993  Fisher et al. .......................... 257/339

Primary Examiner—Edward Wojciechowicz
Attorney, Agent, or Firm—W. James Brady, III; Richard L. Donaldson

[57] ABSTRACT

CMOS power device (10) is provided. A tank region (62) is formed in a semiconductor substrate (60). A polysilicon gate layer (34) is disposed above the tank region (62) and defines a plurality of source and drain diffusion openings (38 and 36) having rounded inner corners (40). A plurality of back-gate contact regions (42) are segmented and are formed in vacancies in a plurality of source regions (30). Multi-level metallization layers (64 and 66) are disposed above an active device region of the semiconductor substrate (60) and comprise: staggered source contacts (44) and vias (46) alternating along a center line where the source contacts (44) are located above and extend over the backgate contact regions (42), drain contacts (48) and vias (50) alternating along a center line, alternating and offset sets of gate contacts (52) and vias (54) alternating and offset where the sets are offset with respect to adjacent sets, source, drain and gate bussing (14, 16 and 20), and a center gate bus (22) located on a center line of the power device (10) coupled to the gate bussing (20). A plurality of source bond pads (18) and drain bond pads (29) are formed on opposite edges of the power device (10) and are coupled to the source bussing (14) and drain bussing (16), respectively. Thick upper level metallization (24) is disposed above the source bussing (14) and the drain bussing (16) and extends between associated bond pads (18 and 29).

25 Claims, 7 Drawing Sheets

| DEVICE | Vds (VOLTS) | Ciss (pF) | Crss (pF) | Coss (pF) |
|---|---|---|---|---|
| CAPACITANCE | | | | |
| TPS1110 | −6 | 282 | 77 | 410 |
| CONVENTIONAL VDMOS | −6 | 1277 | 244 | 986 |
| TPS1110 | 0 | 332 | 110 | 862 |
| CONVENTIONAL VDMOS | 0 | 2617 | 1590 | 3400 |

| DEVICE | Qg (nC) | Qgd (nC) | Qgs (nC) | Vgs(th) (VOLTS) |
|---|---|---|---|---|
| GATE CHARGE | | | | |
| TPS1110 | 5.2 | 0.7 | 0.5 | −1.64 |
| CONVENTIONAL VDMOS | 25.0 | 5.5 | 2.5 | −2.0 |

NORMAL USE
$C_1$ PARALLEL TO $C_2$

POWER PMOS USE
$C_1$ ELIMINATED

CMOS POWER DEVICE AND METHOD OF CONSTRUCTION AND LAYOUT

TECHNICAL FIELD OF THE INVENTION

This invention relates in general to the field of integrated circuits, and more particularly to a CMOS power device and method of construction and layout.

CROSS-REFERENCE TO RELATED APPLICATIONS

This application relates to co-pending patent applications:

U.S. patent Ser. No. 08/299,177 (TI-17968), entitled "Semiconductor Device Having Thick Copper Metallization", filed Aug. 31, 1994;

U.S. patent Ser. No. 07/850,601 (TI-16545), entitled "A Method for Current Ballasting and Busing over Active Device Area Using a Multi-Level Conductor Process", filed Mar. 13, 1992;

U.S. patent Ser. No. 08/333,174 (TI-20030), entitled "A Multiple Transistor integrated Circuit with Thick Copper Interconnect", filed Nov. 2, 1994; and U.S. patent Ser. No. 08/171,878 (TI-15646), entitled "A Windowed Source and Segmented Backgate Contact Linear Geometry Source Cell for Power DMOS Processes", filed Dec. 22, 1993;

each of which is assigned to Texas Instruments Incorporated and is incorporated herein by reference.

BACKGROUND OF THE INVENTION

Battery-operated electronic systems such as notebook personal computers, personal digital assistants, and wireless communication devices often use power CMOS devices as low on-resistance electronic switches for distributing battery power. P-channel MOS (PMOS) transistors are particularly well suited for such switching applications, although N-channel MOS (NMOS) transistors are useful as well. With respect to battery-operated applications, low on-resistance can be particularly important to ensure as little power consumption to the battery as possible. This ensures long battery life.

Conventional PMOS and NMOS transistors for use as switches in battery-operated applications have been constructed using a vertical MOS structure. Vertical structures have been thought to be more cost-effective and area-effective than other device structures such as lateral DMOS structures. Vertical structures, however, suffer from a number of disadvantages including the fact that devices must have a common terminal if more than one device is constructed on the same semiconductor die. Lateral DMOS structures have also been used but are generally higher voltage than needed for these applications.

SUMMARY OF THE INVENTION

A need has arisen for a power device having ultra low on-resistance performance, decreased junction capacitances, enhanced breakdown voltage performance and enhanced safe operating area performance.

In accordance with the present invention, a CMOS power device and method of construction and layout are provided that substantially eliminate or reduce disadvantages and problems associated with previously developed lateral surface power devices for battery power distribution and other power switching applications.

According to one embodiment of the present invention, a CMOS power device is provided. A tank region is formed in a semiconductor substrate. A polysilicon gate layer is disposed above the tank region and defines a plurality of source and drain diffusion openings having rounded inner corners. A plurality of source regions and drain regions are formed by diffusion through the source and drain diffusion openings in the polysilicon. A plurality of backgate contact regions are formed in the plurality of source regions. The plurality of backgate contact regions are segmented, and each is operable to provide contact to the tank region. Multi-level metallization layers are disposed above an active device region of the semiconductor substrate and comprise: source contacts and vias alternating along a center line where the source contacts are located above and extend over the backgate contact regions, drain contacts and vias alternating along a center line, alternated and offset sets of gate contacts and vias where the sets are offset with respect to adjacent sets, source, drain and gate bussing, and a center gate bus located on a center line of the power device coupled to the gate bussing. A plurality of source bond pads and drain bond pads are formed on opposite edges of the power device and are coupled to the source bussing and drain bussing, respectively. Thick upper level metallization is disposed above the source bussing, the drain bussing and extends between associated bond pads. The extension between bond pads provides shorting regions acting to ballast the potential on the source and drain sides.

According to another embodiment of the present invention, a method of layout for a CMOS power device by modifying a layout of a CMOS logic level fabrication process is provided which can be scaled according to CMOS gate oxide and feature scaling and remains compatible with the fabrication process. Inner corners of source diffusion and drain diffusion openings of a polysilicon gate layer are rounded. Segmented backgate contact regions are located in source regions for providing contact to a tank region. Contacts and vias for contacting source regions and drain regions are alternated along a center line. Gate contacts and vias for contacting the polysilicon gate layer are alternated and offset to form alternating sets where the sets are offset with respect to adjacent sets. A center gate bus is located along a center line of the power device. Multiple bond pads are located along a periphery of the device, and thick upper level metallization is located above source and drain bussing and between associated bond pads. The structure can be fully self guard ringed with the outer corners of the poly gate guard ring also being rounded.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Figure 1A:
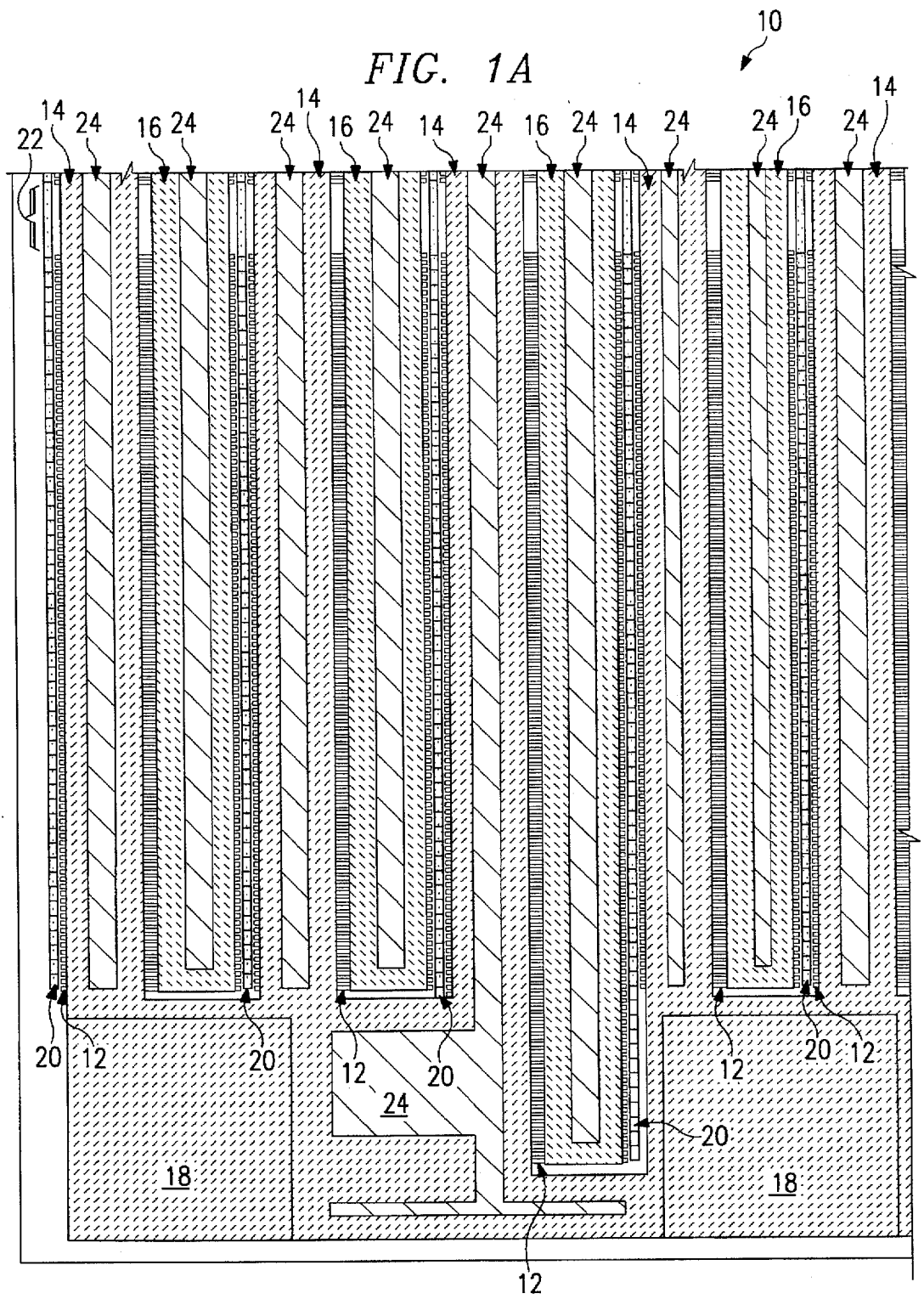
FIG. 1A is a top view of one corner of a CMOS power device constructed according to the teachings of the present invention.

FIG. 1A is a top view of a corner of a lateral CMOS power device, indicated generally at 10, constructed according to the teachings of the present invention. In the embodiment of FIG. 1A, power device 10 comprises a PMOS power device. Power device 10 comprises a plurality of banks 12 of CMOS transistors. Each bank 12 has an associated source bus 14 and drain bus 16. Source bond pads 18 are located along an edge of power device 10 and are connected to each source bus 14. Each drain bus 16 is similarly connected to drain pads (not shown) located on an opposite edge of power device 10. Each bank 12 also has associated gate buses 20. Each gate bus 20 is connected to a center gate bus 22. Thick metal inter-connect 24 is disposed over each source bus 14 and drain bus 16 and extends between associated bond pads as shown.

Figure 1B:
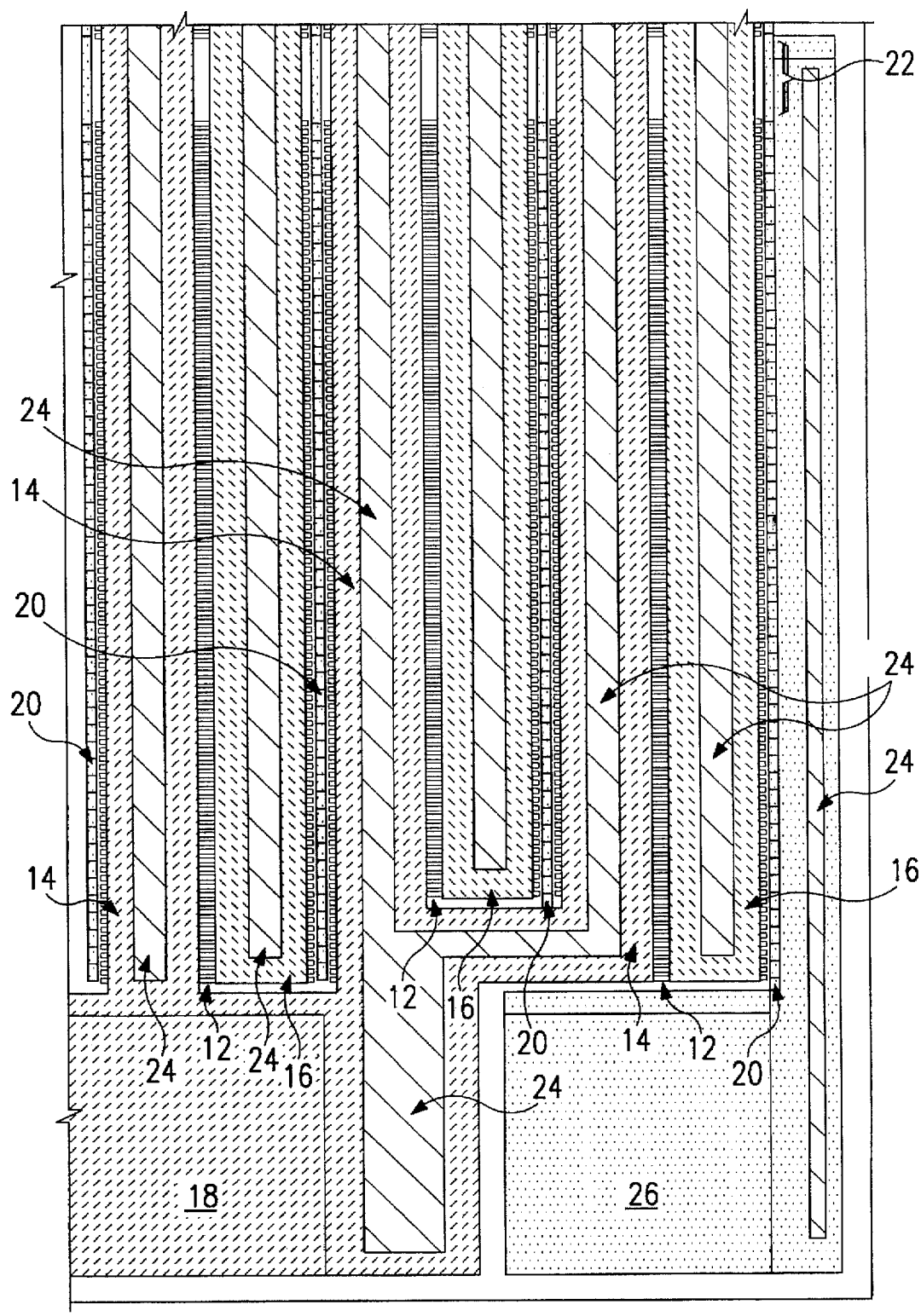
FIG. 1B is a top view of a second corner of the CMOS power device constructed according to the teachings of the present invention.

FIG. 1B is a top view of a second corner of power device 10. As in FIG. 1A, banks 12 of CMOS transistors have an associated source bus 14 and drain bus 16. Banks 12 also have associated gate buses 20 that are connected to central gate bus 22. Central gate bus 22 is coupled to a gate bond pad 26 located on an edge of power device 10. Thick metal interconnect 24 is disposed over each source bus 14 and drain bus 16 and extends between associated bond pads as shown. As shown, thick metal interconnect 24 also extends between gate bond pad 26 and center gate bus 22.

Power device 10 operates as a power PMOS transistor. It should be understood that although a PMOS transistor is described the teachings of the present invention are equally applicable to NMOS transistors and other suitable devices. Power device 10 comprises a plurality of banks 12 comprising numerous PMOS transistors all interconnected to collectively provide power PMOS transistor functionality.

Center gate bus 22 operates to provide symmetrical switching for the PMOS transistors and to create parallel gate resistance reducing the gate impedance. Center gate bus 22 extends down the middle of power device 10 gate buses 20 extending toward the edges of power device. This causes the series resistance of the gate of power device 10 to be in double parallel. The individual source and drain regions are in parallel, and banks 12 are in parallel. The two sides of power device 10 are also in parallel. This parallel structure reduces the on-resistance of power device 10 and overall switching impedance is reduced.

In addition, center gate bus 22 enhances the switching safe operating area performance of power device 10 by reducing the series resistance and hence propagation time across power device 10 yielding a much smoother transition of states. As can be seen in FIGS. 1A and 1B, there are no active components in the center of power device 10. This allows a first level of metallization to be used to create center gate bus 22 and to connect gate buses 20 to center gate bus 22. This center gate bus 22 is shown and described in more detail with respect to FIG. 3.

Multiple source bond pads 18 and drain bond pads (not shown) are located on each edge of power device 10 and are connected to source buses 14 and drain buses 16, respectively. Multiple bond pads are used so that the bond pads and associated bond wires are in parallel reducing associated bond and bond wire resistance. This additionally facilitates packaging in very small dual inline packages. Further, thick metal interconnect 24 extends between associated bond pads as shown. Thick metal interconnect 24 operates both to ensure connections to all active transistors in case one or more bond wires fail or there is a bad bond and to provide a bus bar along each source bus 14, each drain bus 16 and center gate bus 22. The shorting feature between bond pads is a technical advantage of the present invention and also acts as a potential equalizer ensuring uniform operation and natural ballasting. The thick metal interconnect feature used as an active bus is described in U.S. patent Ser. No. 08/299,177 (TI-17968), entitled "Semiconductor Device Having Thick Copper Metallization", filed Aug. 31, 1994, and in U.S. patent Ser. No. 08/333,174 (TI20030), entitled "A Multiple Transistor integrated Circuit with Thick Copper Interconnect", filed Nov. 2, 1994, the disclosures of which are incorporated herein by reference.

Figure 1C:
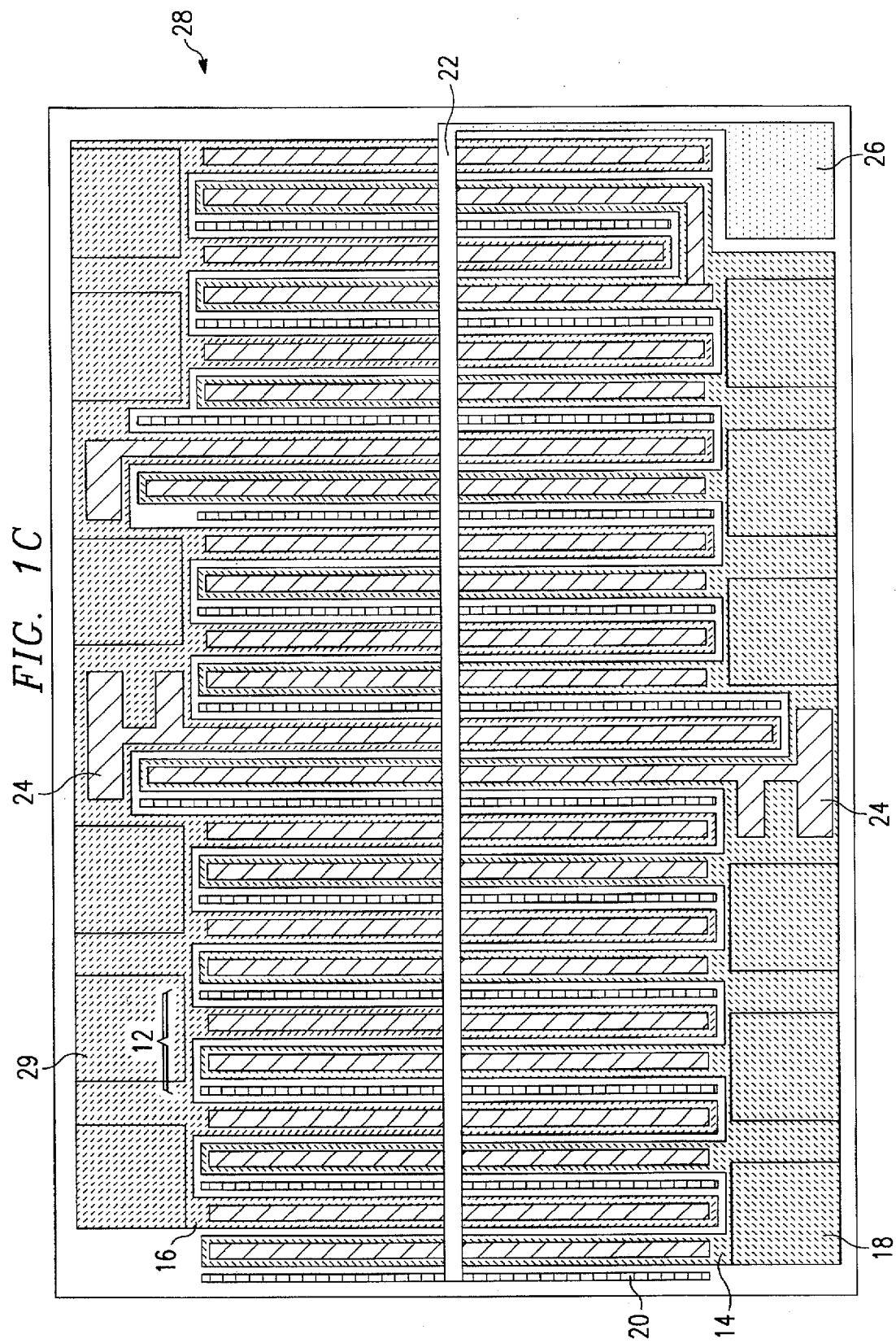
FIG. 1C is a top view of a CMOS power device constructed according to the teachings of the present invention.

FIG. 1C is a top view of a CMOS power device, indicated generally at 28, constructed according to the teachings of the present invention. CMOS power device 28 comprises banks 12 of transistors as described above. Gate busing 14 and drain busing 16 feed to the edge of CMOS power device 28 as shown. A plurality of source bond pads 18 are located on one edge, and a plurality of drain bond pads 29 are located on the opposite edge. Gate busing 20 feeds to center gate bus 22, as shown. Gate bond pad 26 is located on one corner and is connected to center gate bus 22. Thick metal interconnect 24 provides low resistance shorting paths between bond pads in the event one of the bond pads fails. As shown, center gate bus 22 is positioned in the center of CMOS power device 28.

It should be understood that in FIGS. 1A, 1B, and 1C banks 12 extend underneath the busing and thick metal interconnect where hidden by those features.

Figure 2:
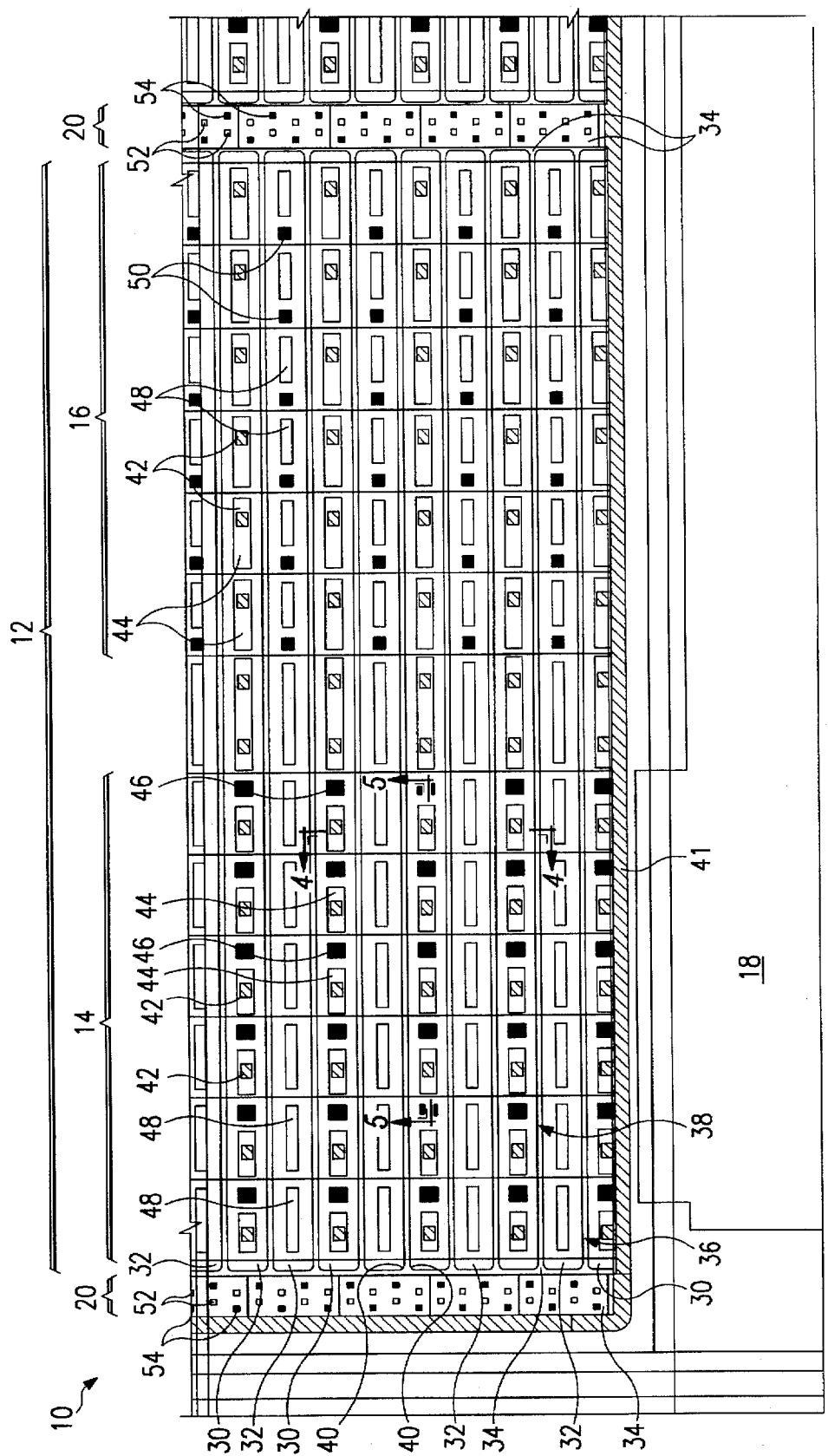
FIG. 2 is a top view of a section of one bank of CMOS transistors of the power device of FIGS. 1A, 1B, and 1C.

FIG. 2 is a top view of one section of a bank 12 of CMOS transistors of power device 10. Each bank 12 includes a plurality of source regions 30 and a plurality of drain regions 32. In the illustrated embodiment, source regions 30 and drain regions 32 comprise P-regions formed in an N-tank on a P-substrate.

A polysilicon gate layer 34 defines source diffusion openings 38 and drain diffusion openings 36 as shown. Source diffusion openings 38 and drain diffusion openings 36 have rounded inner corners 40 defined by polysilicon gate layer 34. This feature is different from standard CMOS layout and ensures that high field cornering breakdown does not occur. In general, standard CMOS is terminated with a channel stop implant instead of a poly defined tank termination of the illustrated embodiment. Source regions 30 and drain regions 32 are formed by diffusion through source diffusion openings 38 and drain diffusion openings 36, respectively.

Polysilicon layer 34 is formed with round corner openings. In addition, guard ring 41 has rounded corners and a p-type region self-aligned with rounded corners providing a self guard ring structure and thus eliminating the need for a channel stop implant. A plurality of backgate contact regions 42 are formed separately in each source region 30. Backgate contact regions 42 are segmented along each source region 30 as shown. Backgate contact regions 42 are formed separately where regions of the source region 30 are left absent. This is different than standard CMOS where backgate regions are formed every several devices or separately away from the active source and drain region. It is important to have close backgate contact for reverse bias safe operation.

Multi-level interconnect layers provide contacts, metallization, and vias with respect to source regions 30, drain regions 32 and gate layer 34. Power device 10 comprises two level metal where the first level contacts the devices, and the second level provides busing. The first level metal connects to the devices through contacts, and the second level metal connects to the first level metal through vias.

Source contacts 44 and source vias 46 are alternated along a center line, and source contacts 44 are located over backgate contact regions 42 as shown. Drain contacts 48 and drain vias 50 similarly are alternated along a center line across drain regions 32. Gate contacts 52 and gate vias 54 are alternated and offset to form alternating sets where the sets are offset with respect to adjacent sets, as shown. Gate busing 20 contacts polysilicon gate layer 34 through gate contacts 52 and through gate vias 54. Source bus 14 contacts source regions 30 through source contacts 44 and through source vias 46. Source bus 14 also contacts the N-tank (or backgate) through backgate contact regions 42. Drain bus 16 contacts drain regions 32 through drain contacts 48 and through drain vias 50.

Backgate contact regions 42 are segmented and provide contact to the backgate while allowing source regions 30 to be relatively narrow. This feature is described in U.S. patent Ser. No. 08/171,878, filed Dec. 22, 1993, entitled "A Windowed Source and Segmented Backgate Contact Linear Geometry Source Cell for Power DMOS Processes" (TI-15646), the disclosure of which is incorporated herein by reference.

Source contacts 44 and source vias 46 as well as drain contacts 48 and drain vias 50 are alternated along a center line in source regions 30 and drain regions 32 to enhance performance of power device 10. Source contacts 44 and drain contacts 48 make ohmic contact to source regions 30 and drain regions 32, respectively. With respect to source regions 30, contact with backgate contact regions 42 is accomplished as well. As shown in FIG. 2, source contacts 44 are situated over each segment of a backgate contact region 42 and extend on either side such that efficient contact to source region 30 is also made. Power device 10 exhibits excellent safe operating area performance disproving conventional teaching that backgate contact regions 42 need to be continuous to ensure good safe operating area performance.

The location of source and drain contacts 44 and 48 and vias 46 and 50 differ with respect to the source bus 14 side and the drain bus 16 side of bank 12. Space is made between source contacts 44 on the source bus 14 side to provide a region sufficiently wide to locate source via 46 for contact to source bus 14. On the source bus 14 side, with respect to drain regions 32, contacts are increased in length in favor of extra contact to drain regions 32. Drain vias 50 are omitted in drain regions 32 on source buss region 14 so that electrical isolation is established between drain conductor over drain region 32 and source bussing that passes over the drain conductor. On the drain bus 16 side, space is made between drain contacts 48 so as to provide a region sufficiently wide to locate drain vias 50 for contact to drain bus 16. With respect to source regions 30, contacts are increased in favor of extra contact to source regions with respect to source regions 30 on the drain bus 16 side. Source vias 46 are omitted in source regions 30 on drain buss region 16 so that electrical isolation is established between source conductor over source region 30 and drain bussing that passes over the source conductor.

Polysilicon gate layer 34 has source diffusion openings 36 and drain diffusion openings 38 with rounded inner corners 40 to enhance the shallow P-diffusions which make source regions 30 and drain regions 32. Rounded inner corners 40 in the polysilicon patterns operate to ensure that source regions 30 and drain regions 32 have uniform breakdown and good safe operating area performance. Logic level CMOS devices are commonly laid out with square inner corners in polysilicon gate layer 34 and with no regard to safe operating area (SOA) concerns. In a power device, such a layout would cause breakdown in the source and drain regions at the square inner corners because of spherical junction and field crowding under reverse bias. The use of rounded inner corners 40 in the polysilicon patterns prevents diffusion patterns that cause such poor performance.

Each gate bus 20 is connected to polysilicon gate layer 34 using alternated and offset sets of gate contacts 52 and gate vias 54 which enhance contact reliability and reduce series gate bus resistance. Low gate resistance eliminates delays in gate propagation during high speed switching. The alternating and offset nature of gate contacts 52 and gate vias 54 allow for maximizing the amount of connectivity between polysilicon gate layer 34 and the first and second metallization layers and is essential because of differing layout guideline spacings between poly, contacts and vias. This positioning also provides current ballasting along gate bus 20 and minimizes resistance for a minimum gate bus width. Such current ballasting is described in U.S. patent Ser. No. 07/850,601, entitled "A Method for Current Ballasting and Busing Over Active Device Area Using a Multi-Level Conductor Process", filed Mar. 13, 1992 (TI-16545), the disclosure of which is incorporated herein by reference. The alternating and offsetting of set of gate contacts 52 and vias 54 enhances performance while saving on gate bus area. The relatively narrow bus width minimizes gate to source capacitance which is important to switching. In addition, source P-diffusion is allowed underneath central gate bus 22 so that gate to drain capacitance is minimized.

Figure 3:
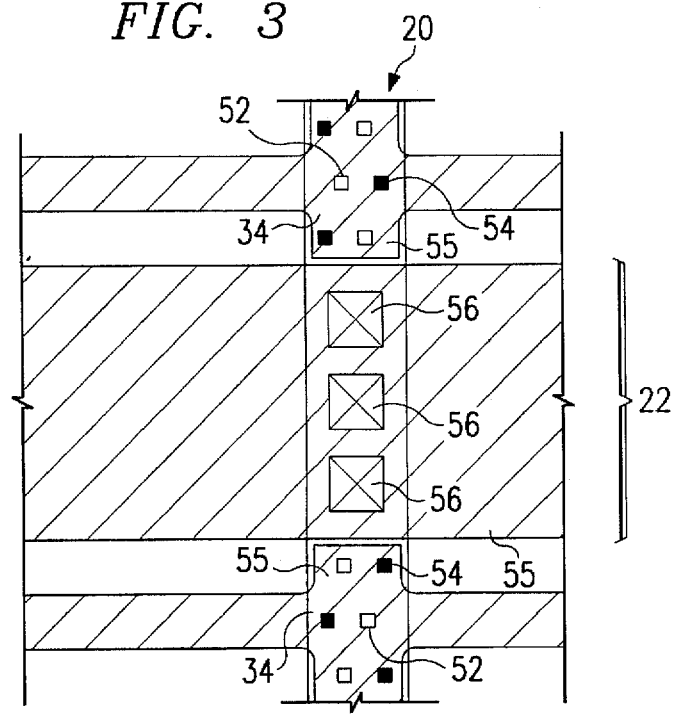
FIG. 3 is a top view of one embodiment of a connection of the center gate bus to the gate bussing.

FIG. 3 is a top view of one embodiment of a connection of center gate bus 22 to gate busing 20. Gate busing 20 comprises first and second level metal interconnected through vias 54. Contacts 52 provide contact to underlying polysilicon layer 34. The first level of metal, labeled 55, provides center gate bus 22, as shown. Gate busing 20 is connected to center gate bus 22 through second level metal using vias 56. In this manner, the gates of the CMOS transistors are connected to center gate bus 22. It should be noted gate busing 20 is in parallel with respect to center gate bus 22 and in parallel with the other gate busing 20 thus being in double parallel as mentioned before.

Figure 4:
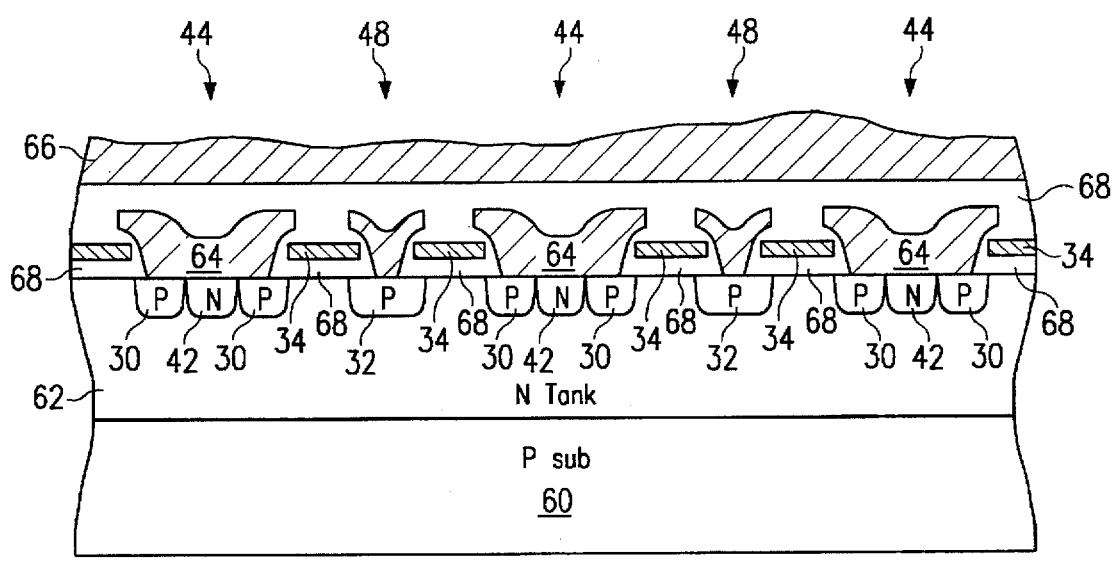
FIG. 4 is a cross-section of the CMOS transistors of FIG. 2 cut across the transistors.

FIG. 4 illustrates a cross-section of power device 10 cut, as shown in FIG. 2, across source regions 30, drain regions 32 and backgate contact regions 42. Power device 10 is built on a P-substrate 60. An N-tank region 62 is formed in substrate 60. Source regions 30 and drain regions 32 are then formed in N-tank 62 by P-diffusions through openings in polysilicon gate layer 34. Backgate contact regions 42 are formed through vacancies in source regions 30. It should be understood that, in the illustrated embodiment, backgate contact regions 42 are not formed in source regions 30, but through the vacancies therein. A first layer of metal 64 provides connection through source contacts, indicated generally at 44, to source regions 30 and backgate contact regions 42. First layer of metal 64 also provides connection through drain contacts, indicated generally at 48, to drain regions 32. A second layer of metal 66 provides contacts to first layer of metal 64 through vias (not shown). Oxide layers 68 separate the layers of metallization as shown. In some places, there is also thick metal interconnect 24 disposed above second level metal 66 (not shown) as discussed above.

Figures 5, 6A, 6B:
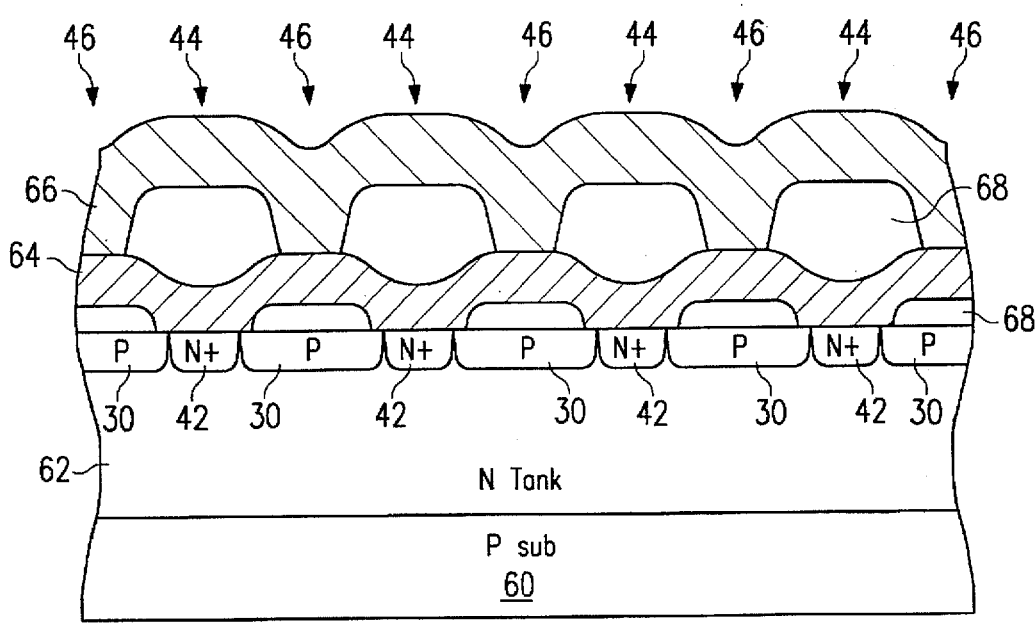
FIG. 5 is a cross-section of the CMOS transistors of FIG. 2 cut along a source region.
FIGS. 6A and 6B illustrate capacitance and gate charge measured for a CMOS power device constructed according to the teachings of the present invention compared with that measured for a conventional vertical DMOS power device.

FIG. 5 illustrates a cross-section of power device 10 cut, as shown in FIG. 2, along a source region 30. As described above, N-tank 62 is formed in semiconductor substrate 60. Source regions 30 are formed in N-tank 62 by diffusion through polysilicon layer 34 (not shown). First level metal 64 provides contacts to source region 30 and backgate contact regions 42 through source contacts, indicated generally at 44. Second level metal 66 contacts first level metal 64 through source vias, indicated generally at 46. Oxide layers 68 separate metallization layers as shown. As mentioned above, there is thick metal interconnect 24 disposed above second level metal 66. FIG. 5 is a cross-section of source region 30 in the source bus 14 side of source region 30. As described above, on the drain bus 16 side, there would not be source vias 46.

Power device 10 comprises a number of features unique to power device 10 that are not standard features of CMOS transistors manufactured in a logic level CMOS process. By virtue of these features, power device 10 can be constructed using a logic level CMOS process yet operate with low on-resistant performance, decreased junction capacitance, enhanced breakdown voltage performance and enhanced safe operating area performance.

Power device 10 can comprise a CMOS power device constructed using a CMOS logic level fabrication process which can be scaled according to CMOS gate oxide and feature scaling and remains compatible with the fabrication process. Generally, the power device can be constructed by first forming a tank region in a semiconductor substrate. A polysilicon gate layer can then be disposed over the tank region where the polysilicon gate layer defines source and drain diffusion openings that have rounded inner corners. Source regions and drain regions can be formed by diffusion through the source and drain diffusion openings, respectively. Backgate contact regions can be formed in the source regions where the backgate contact regions are segmented and provide contact to the tank region. Multi-level metallization layers can be disposed over the polysilicon gate layer and over the source and drain regions. The metallization can include source contacts and vias alternating along a center line with the source contacts located above and extending over the backgate contacts. In addition, drain contacts and vias can be alternated along a center line, and gate contacts and vias can be alternated and offset in sets of contacts and vias. Source, drain and gate bussing can be formed by the second level of metal. A center gate bus extending along a center line of the power device and coupled to the gate bussing can be formed by the first level metal. Source bond pads and drain bond pads can be formed in opposite edges of the power device and can be connected to source bussing and drain bussing, respectively. Thick upper level metallization can be disposed over the source and drain bussing and extend between associated bond pads. The resulting power device demonstrates good power device performance while being manufacturable in a logic level CMOS fabrication process.

FIGS. 6A and 6B illustrate a comparison of capacitance and gate charge measured for a CMOS power device constructed according to the teachings of the present invention and that measured for a conventional vertical DMOS power device. With respect to FIGS. 5A and 5B, the CMOS power device upon which measurements were made comprised a TPS1110 PMOS transistor constructed by TEXAS INSTRUMENTS INCORPORATED located in Dallas, Tex. The conventional p-channel vertical DMOS power device comprised a typical conventional vertical power devices. These two devices have comparable $R_{DS}$-on ratings.

As shown in FIG. 6A, the input capacitance common source, reverse capacitance common source, and output capacitance common source were measured for the CMOS power device and the vertical DMOS device. These capacitances were measured both at $V_{DS}$ equal to −6 volts and equal to zero volts. As can be seen, the conventional vertical DMOS power device had a much higher capacitance in each category than the CMOS power device constructed according to the teachings of the present invention.

With respect to FIG. 6B, the gate charge of the two power devices was measured with $V_{DS}$ equal to −7 volts, $I_D$ equal to −3 amps, and $V_{GS}$ equal to −7 volts. The total gate charge required to charge the gate to −7 volts, the gate charge required to slew $V_{DS}$ by −7 volts, and the gate charge needed to charge the gate to threshold voltage were measured. As can be seen, the CMOS power device, constructed according to the teachings of the present invention, required less charge in each case than did the conventional vertical DMOS power device.

The lower capacitances and less required gate charge is a technical advantage of the present invention. Switching losses are reduced, power loss due to transferring charge to the capacitances is reduced, power dissipation in the circuit that drives the gate of the transistor is reduced, and the driver that drives the gate of the transistor can be downsized.

Another technical advantage of the present invention is the use of a logic level CMOS fabrication process to construct a power device. An initial layout based upon a standard logic level layout can be modified to construct a layout for building a power device. Because a logic level process is used, standard logical level devices can be fabricated on the same semiconductor die and fabrication process scaling applied. A further technical advantage is that the application of scaling allows multiple CMOS power devices of different layouts containing minimum features, for example 1.0, 0.8 and 0.72 micron technologies.

An additional technical advantage of the present invention is the ability to construct a single chip solution providing both power transistor functionality and control logic intelligence for selective drive of battery or other power source. Because the logic level CMOS process can be used to construct both the power device and logic devices, a single chip may include multiple outputs and multiple CMOS logic devices. In addition, alternate material types can be used to also form CMOS power devices comprising n-channel and p-channel complementary devices having opposite diffusion types.

Figure 7A:
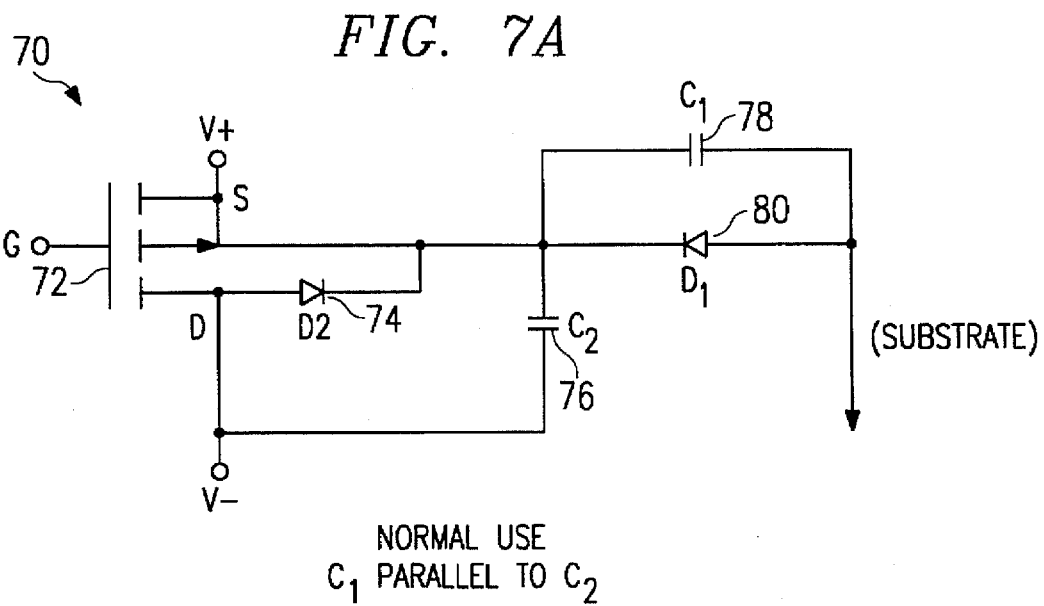
FIGS. 7A and 7B illustrate schematic diagrams showing a connection of a device in normal use and a connection tying the substrate to the source in a power use.
Figure 7B:
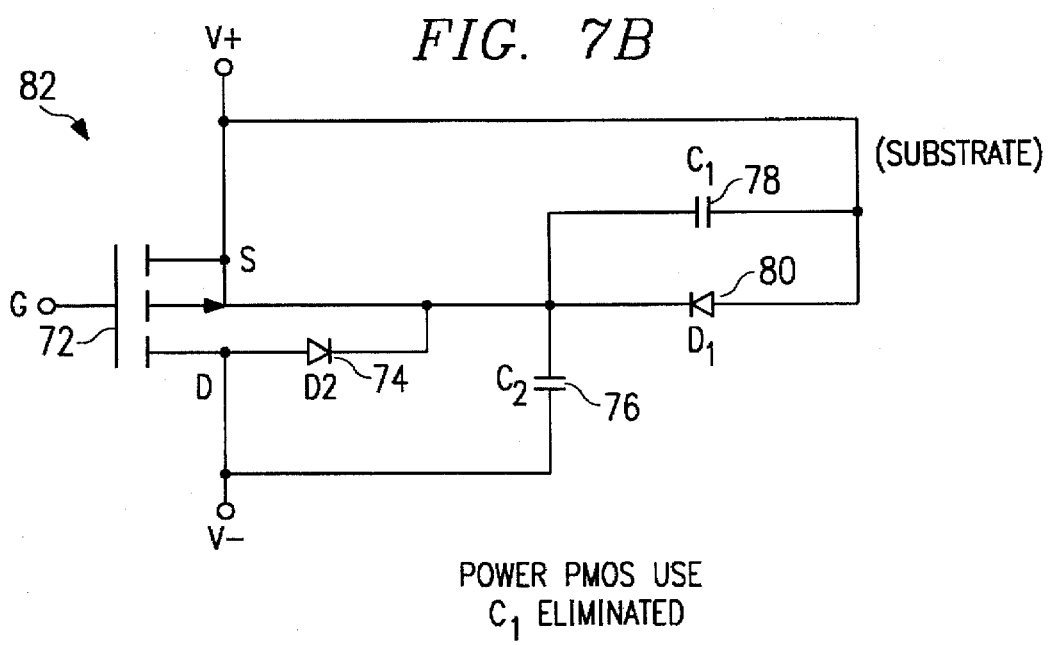

FIGS. 7A and 7B illustrate schematic diagrams showing a connection of a device in normal use and a connection tying the substrate to the source in a power use. As shown in FIG. 7A, a first schematic, indicated generally at 70, shows a PMOS device 72 having a gate, source and drain. The source of PMOS device 72 is connected to a positive voltage V+ and to the backgate. The drain is connected to a negative voltage V−. A diode 74 represents the junction between the drain region and the n-tank or backgate of device 72. A capacitor 76 represents the capacitance between the drain region and the backgate. A capacitor 78 represents the capacitance between the backgate and the substrate of device 72, and a diode 80 represents the junction between the backgate and substrate. As can be seen, capacitor 76 and capacitor 78 are in parallel in the normal use connection of schematic 70.

As shown in FIG. 7B, a second schematic, indicated generally at 82, shows PMOS device 72 connected for power PMOS use. The substrate is tied to the source region of device 72. This tying of the substrate to the source eliminates capacitor 78.

A further technical advantage of the present invention is the ability to tie the substrate to the source in order to remove the capacitance between the substrate and the N-tank. This is possible due to the CMOS structure and can be done in the integrated circuit or in the lead frame for the power device. In addition, due to its size, the power device can be mounted in a small outline package.

The embodiments of the present invention described herein are not intended nor should be construed to limit the teachings of the present invention. Other structures including both NMOS and PMOS power devices are possible.

Although the present invention has been described in detail, it should be understood that various changes, substitutions and alterations can be made hereto without departing from the spirit and scope of the invention as defined by the appended claims.

What is claimed is:

1. A CMOS power device, comprising:
   a semiconductor substrate;
   a tank region formed in the semiconductor substrate;
   a polysilicon gate layer disposed above the tank region, the polysilicon gate layer defining a plurality of source diffusion openings and a plurality of drain diffusion openings all having rounded inner corners;
   a plurality of source regions formed by diffusion through the plurality of source diffusion openings;
   a plurality of drain regions formed by diffusion through the plurality of drain diffusion openings;
   a plurality of backgate contact regions formed in vacancies in the plurality of source regions, the plurality of backgate contact regions being segmented and each operable to provide contact to the tank region;
   multi-level metallization layers disposed above an active device region of the semiconductor substrate, the multi-level metallization layers comprising;
      source contacts and vias alternating along a center line, the source contacts located above and extending over the backgate contact regions;
      drain contacts and vias alternating along a center line;
      sets of gate contacts and vias alternating and offset where the sets are offset with respect to adjacent sets;
      source, drain and gate bussing; and
      a center gate bus located on a center line of the power device, the center gate bus coupled to the gate bussing;
   a plurality of source bond pads formed on a first edge of the power device, the source bond pads coupled to the source bussing;
   a plurality of drain bond pads formed along a second edge of the power device, the drain bond pads coupled to the drain bussing; and
   thick upper level metallization disposed above the source bussing, the drain bussing and extending between associated bond pads.

2. The power device of claim 1, wherein the source regions and drain regions are parallel and the source regions are separated by a drain region.

3. The CMOS transistor of claim 2, wherein the source regions and the drain regions are arranged in parallel banks.

4. The power device of claim 1, wherein the semiconductor substrate comprises a P-type silicon substrate, the tank region comprises an N-type region, the source and drain regions comprise P-type regions, and the backgate contact regions comprise N-type regions.

5. The power device of claim 1, wherein the multi-level metallization layers comprise a first metal layer and a second metal layer.

6. The power device of claim 1, wherein the thick upper level metallization comprises plated copper metallization layers.

7. The power device of claim 1, wherein the semiconductor substrate is connected to the plurality of source regions.

8. The power device of claim 1, further comprising at least one multiple output device formed on the semiconductor substrate.

9. The power device of claim 1, further comprising at least one CMOS power device formed on the semiconductor substrate using alternate material types comprising n-channel and p-channel complementary devices having opposite diffusion types.

10. A method of layout for a CMOS power device by modifying a layout of a CMOS logic level fabrication process which can be scaled according to CMOS gate oxide and feature scaling and remains compatible with the fabrication process, comprising:
   rounding inner corners of source diffusion and drain diffusion openings of a polysilicon gate layer;
   locating segmented backgate contact regions in source regions for providing contact to a tank region;
   alternating contacts and vias along a center line for contacting source regions and drain regions;
   alternating and offsetting gate contacts and vias for contacting the polysilicon gate layer where the sets are offset with respect to adjacent sets;
   locating a center gate bus along a center line of the power device;
   locating multiple bond pads along a periphery of the device; and
   locating thick upper level metallization above source and drain bussing and extending between associated bond pads.

11. The method of claim 10, wherein staggering contacts and vias comprises alternating contacts and vias along the center of the source and gate regions.

12. The method of claim 10, wherein alternating and offsetting gate contacts and vias comprises alternating pairs of gate contacts and vias.

13. The method of claim 10, wherein locating multiple bond pads comprises locating source bond pads on one edge of the power device and locating drain bond pads on an opposite edge of the power device.

14. The method of claim 10, wherein locating thick metal interconnect comprises locating plated copper interconnect along a center of each source bus and drain bus and between associated bond pads for ballasting and shorting.

15. The method of claim 10, wherein the power device layout comprises a layout for PMOS transistors.

16. A method of construction for a CMOS power device using a CMOS logic level fabrication process, comprising:
   forming a tank region in a semiconductor substrate;
   disposing a polysilicon gate layer above the tank region, the polysilicon gate layer defining a plurality of source diffusion openings and a plurality of drain diffusion openings all having rounded inner corners;

forming a plurality of source regions by diffusion through the plurality of source diffusion openings;

forming a plurality of drain regions by diffusion through the plurality of drain diffusion openings;

forming a plurality of backgate contact regions in the plurality of source regions, the plurality of backgate contact regions being segmented and each operable to provide contact to the tank region;

disposing multi-level metallization layers above an active device region of the semiconductor substrate, the multi-level metallization layers;

forming source contacts and vias alternating along a center line, the source contacts located above and extending over the backgate contact regions;

forming drain contacts and vias alternating along a center line;

forming sets of gate contacts and vias alternating and offset where the sets are offset with respect to adjacent sets;

forming source, drain and gate bussing; and forming a center gate bus located on a center line of the semiconductor device, the center gate bus coupled to the gate bussing;

forming a plurality of source bond pads on a first edge of the semiconductor substrate, the source bond pads coupled to the source bussing;

forming a plurality of drain bond pads along a second edge of the semiconductor substrate, the drain bond pads coupled to the drain bussing; and disposing thick upper level metallization above the source bussing, the drain bussing and extending between associated bond pads.

17. The method of claim 16, wherein disposing the polysilicon gate layer comprises disposing a polysilicon layer defining source and drain diffusion openings that are parallel and that alternate.

18. The method of claim 16, wherein the polysilicon layer defines source and drain diffusion openings that are arranged in parallel banks.

19. The method of claim 16, further comprising forming with the polysilicon layer a contiguous structure that forms a self guard ring and self aligned device.

20. The method of claim 16, wherein forming the tank region comprises forming an N-type region in a P-type silicon substrate, forming the source and forming the drain regions comprise forming P-type regions, and forming the backgate contact regions comprises forming N-type regions.

21. The method of claim 16, wherein disposing the multi-level metallization layers comprises disposing a first metal layer and a second metal layer.

22. The method of claim 16, wherein disposing the thick upper level metallization comprises disposing copper metallization layers.

23. The method of claim 16, further comprising connecting the semiconductor substrate to the plurality of source regions.

24. The method of claim 16, further comprising forming at least one multiple output device on the semiconductor substrate.

25. The method of claim 16, further comprising forming at least one CMOS power device on the semiconductor substrate using alternate material types comprising n-channel and p-channel complementary devices having opposite diffusion types.

\* \* \* \* \*